(12) United States Patent
Leung et al.

(10) Patent No.: US 6,376,978 B1
(45) Date of Patent: Apr. 23, 2002

(54) QUARTZ ANTENNA WITH HOLLOW CONDUCTOR

(75) Inventors: Ka-Ngo Leung, Hercules; Elie Benabou, Alameda, both of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/519,139

(22) Filed: Mar. 6, 2000

(51) Int. Cl.$^7$ .................................................. B32B 9/00
(52) U.S. Cl. .............................. 313/359.1; 313/231.31; 313/231.41; 315/118.81; 428/210; 428/432; 428/450; 428/467; 428/469
(58) Field of Search ......................... 313/359.1, 231.31, 313/231.41; 315/111.71, 111.81; 174/15.6, 24, 68.3, 99 R, 110 R, 15.1, 110 A; 343/866, 731; 428/210, 432, 450, 467, 469

(56) References Cited

U.S. PATENT DOCUMENTS

| 4,725,449 A | 2/1988 | Ehlers et al. |
| 5,434,353 A | 7/1995 | Kraus |
| 5,587,226 A | 12/1996 | Leung et al. |

*Primary Examiner*—Ashok Patel
(74) *Attorney, Agent, or Firm*—Henry P. Sartorio

(57) ABSTRACT

A radio frequency (RF) antenna for plasma ion sources is formed of a hollow metal conductor tube disposed within a glass tube. The hollow metal tubular conductor has an internal flow channel so that there will be no coolant leakage if the outer glass tube of the antenna breaks. A portion of the RF antenna is formed into a coil; the antenna is used for inductively coupling RF power to a plasma in an ion source chamber. The antenna is made by first inserting the metal tube inside the glass tube, and then forming the glass/metal composite tube into the desired coil shape.

15 Claims, 2 Drawing Sheets

US 6,376,978 B1

QUARTZ ANTENNA WITH HOLLOW CONDUCTOR

GOVERNMENT RIGHTS

The United States Government has the rights in this invention pursuant to Contract No.DE-AC03-76SF00098 between the United States Department of Energy and the University of California

BACKGROUND OF THE INVENTION

The invention relates to antennas for radio frequency (RF) driven plasma ion sources.

An ion source is a plasma generator from which beams of ions can be extracted. Multi-cusp ion sources have an arrangement of magnets that form magnetic cusp fields to contain the plasma. Plasma can be generated in a multi-cusp ion source by DC discharge or RF induction discharge.

Unlike the filament DC discharge where eroded filament material can contaminate the chamber, RF discharges have a longer lifetime and cleaner operation. In an RF driven source, an induction coil or antenna placed into the ion source chamber is used for the discharge. However, there are problems with presently available RF antennas for plasma ion source applications.

U.S. Pat. No. 4,725,449 to Ellers et al. describes an RF antenna formed of a coil of copper tubing with a glass coating produced by applying a powdered glass frit, melting the frit to form a molten glass coating and cooling to solidify the glass to form a bonded glass coating on the tubing.

U.S. Pat. No. 5,434,353 to Kraus describes an RF antenna formed of a coiled quartz glass tube with a flexible wire inside the glass tube or with an electrically conducting layer precipitated on the inner wall of the tube.

U.S. Pat. No. 5,587,226 to Leung et al. describes an RF antenna formed of a tubular metal coil with a porcelain enamel coating bonded to the metal tubing.

The earliest RF antennas were made of bare conductors, but are subject to arcing and contamination. The bare antenna coils were then covered with sleeving material made of woven glass or quartz fibers or ceramic, but these were poor insulators. The glass or porcelain coated metal tubes were subject to differential thermal expansion between the coating and the conductor, which could lead to chipping and contamination. The glass tubes form good insulators for RF antennas, but in the design having a glass tube containing a wire or internal surface coating of a conductor, coolant flowing through the glass tube is subject to leakage upon breakage of the glass tube, thereby contaminating the entire apparatus in which the antenna is mounted with coolant.

SUMMARY OF THE INVENTION

Accordingly, it is an object of the invention to provide an improved RF antenna.

It is also an object of the invention to provide an RF antenna which has a glass tube insulator, but which is not subject to coolant leakage if the glass tube breaks.

It is another object of the invention to provide an RF antenna which has a metal tube coil disposed within a glass tube insulator.

It is a further object of the invention to provide a plasma ion source with an RF antenna which has a glass tube insulator, but which is not subject to coolant leakage if the glass tube breaks.

The invention is a radio frequency (RF) antenna for plasma ion sources. The RF antenna is formed of a metal tube disposed within a glass or quartz tube and formed into a coil. Thus the antenna is a metal tube coil inside a protective quartz tube. More generally the antenna is formed of a conducting tube, e.g. metal or alloy, within an insulating tube, e.g. glass or quartz.

The invention includes the method of making the RF antenna by first inserting the metal tube into the quartz tubing, and then heating the quartz tube with the inserted metal tube and bending the heated nested tubes into a coil. With this RF antenna design, coolant is circulated through the interior of the metal tubing so that breaks in the quartz tubing do not cause coolant loss.

The invention also includes a plasma ion source, typically a multi-cusp ion source, with an RF antenna formed of a metal tube coil inside a protective quartz tube.

DETAILED DESCRIPTION OF THE INVENTION

Figure 2:
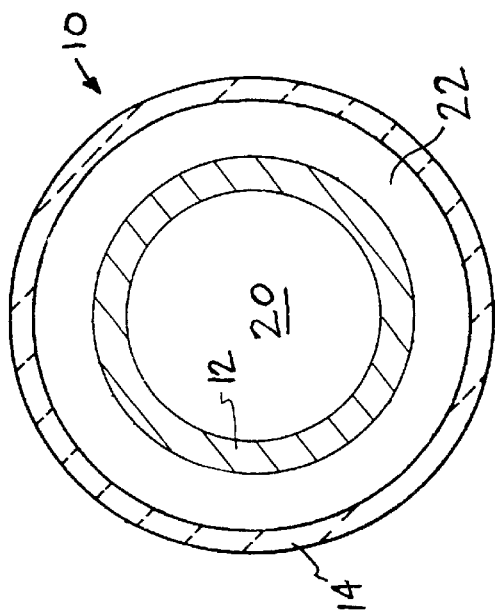
FIG. 2 is a cross sectional view taken along line 2—2 in FIG. 1.
Figure 1:
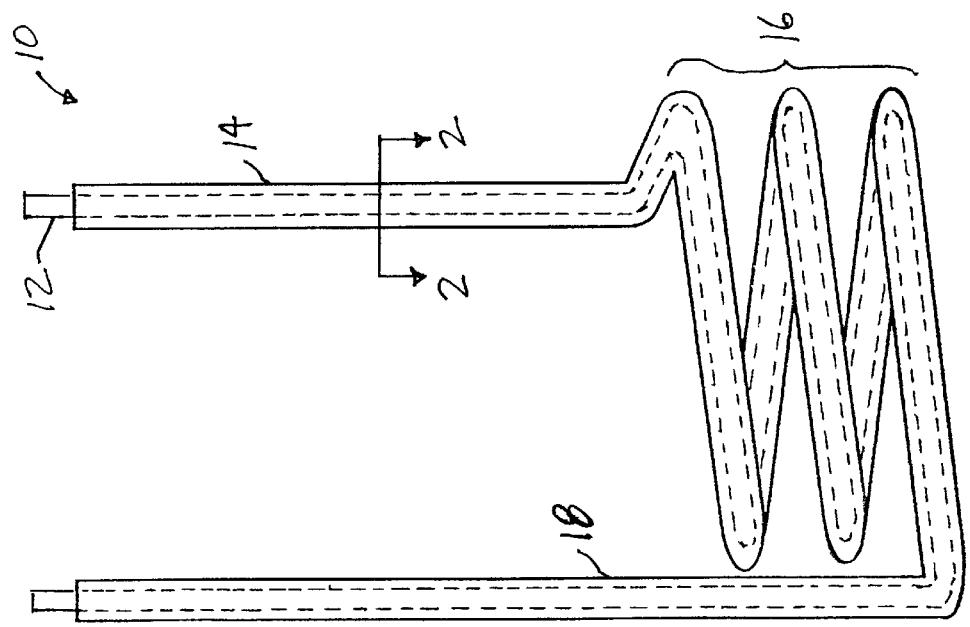
FIG. 1 is a side view of an RF antenna according to the invention.

A plasma ion source radio frequency (EF) antenna 10, as shown in FIGS. 1 and 2, has a hollow conducting (e.g. metal or alloy) tube 12 disposed within an insulating (e.g. quartz or glass) tube 14. Antenna 10 is in the form of a coil 16 with straight portions 18 extending therefrom for electrical connection to an RF power source. Coil 16 of antenna 10 may vary in diameter of the turns of the coil and the number and spacing of the turns. Coil 16 is typically helical but may take other shapes.

The hollow tubular conductor 12 of antenna 10 defines a coolant flow channel 20 therein, as shown in FIG. 2. The tubular conductor 12 is positioned inside insulating tube 14. The outer diameter of tube 12 is less than the inner diameter of tube 14 so that an annular space 22 will generally be defined therebetween. However, the hollow conducting tube 12 and insulating tube 14 are essentially independent integral structures. Thus insulating tube 14 provides a good insulator for antenna 10 but the combined structure does not suffer from differential expansion effects. However, in the coil configuration of the antenna 10, the tube 12 will contact tube 14 at some points, holding the tube 12 fixed within tube 14.

Antenna 10 is fabricated by first inserting a straight metal tube 12 into a straight quartz tube 14. Successive portions of the composite tube formed of nested tubes 12, 14 are then heated to a sufficient temperature so that both the quartz tube 14 and metal tube 12 can be bent. The pliant parts of the tubes are bent around a jig or mandrel to produce the proper shape and size coil. The jig is of the desired coil diameter and may have grooves at the desired coil spacing. After bending into shape, the coil is allowed to cool to form the finished antenna.

Tube 12 is typically made of titanium or stainless steel, and tube 14 is typically made of quartz glass. Quartz glass has a high melting point and titanium and stainless steel also have high melting points so that the nested tubes can be heated and bent together to form the coil. Therefore, a high melting point glass will generally be used for the tube 14 and a high melting point metal or alloy will be used for the tube 12. For some applications, a lower melting point metal like copper and a lower melting point glass might be used. The tubes are generally circular in cross section, but may take other shapes. Typical dimensions of the tubes 12 and 14 are as follows: the quartz tubes may have 3 mm ID×5 mm OD or 4 mm ID×6 mm OD, and stainless steel tubes may have 1 mm ID×2 mm OD. However, a wide range of tube sizes can be used, and a wide range of antenna sizes can be formed.

In operation a coolant is flowed through coolant flow channel 20 inside metal tube 12. If outer glass tube 14 should break, coolant in flow channel 20 will not leak out of the antenna 10 because it is confined inside metal tube 12. Thus antenna 10 provides a safe coolant design without risk of coolant leakage.

Figure 3:
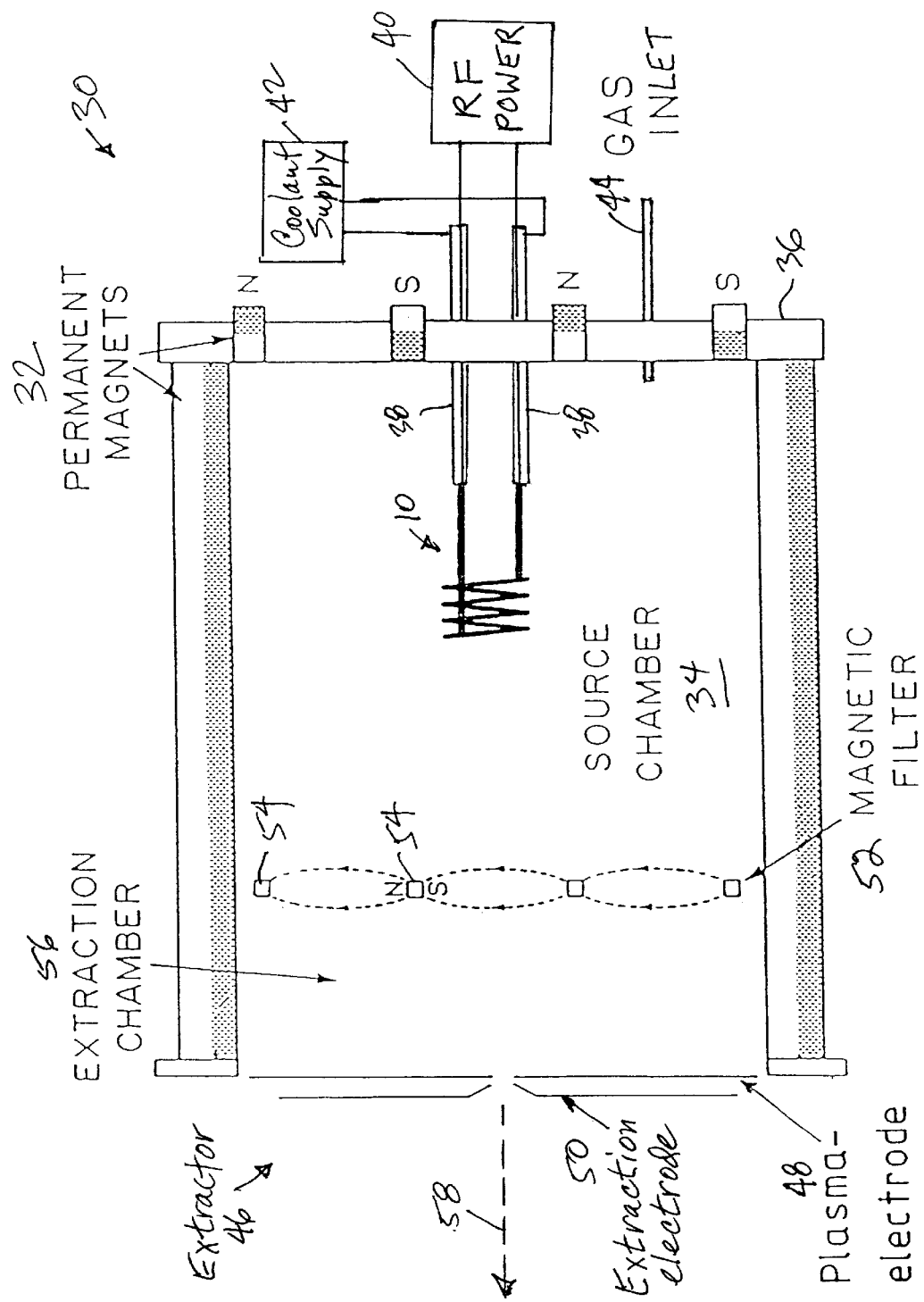
FIG. 3 is a sectional view of a plasma ion source with the RF antenna of the invention.

A plasma ion source 30, which incorporates the RF antenna 10, is illustrated in FIG. 3. Plasma ion source 30 is preferably a multi-cusp ion source having a plurality of permanent magnets 32 arranged with alternating polarity around a source chamber 34, which is typically cylindrical in shape. Additional permanent magnets 32 are also positioned in back plate 36. Electrical feedthroughs 38 in back plate 36 provide for mounting the RF antenna 10 inside source chamber 34, and for connecting the antenna 10 to an RF power source 40 (which includes suitable matching circuits). The coolant from coolant supply 42 may also be input into the coolant flow channel of antenna 10 through feedthroughs 38. Gas inlet 44 in back plate 36 allows the gas to be ionized to be introduced into source chamber 34.

The opposed end of the ion source chamber 34 from back plate 36 is closed by an extractor 46 formed of a plasma electrode 48 and an extraction electrode 50 which contain central apertures through which the ion beam can pass or be extracted by applying suitable voltages to electrodes 48, 50. An optional permanent magnet filter 52 formed of spaced magnets 54 can be installed in the source chamber 34 of plasma ion source 30, creating an extraction chamber region 56 adjacent to the extractor 46. Magnetic filter 52 reduces the energy spread of the extracted ions.

In operation, the RF driven plasma ion source 30 produces ions in source chamber 34 by inductively coupling RF power through RF antenna 10. The ions pass through optional magnetic filter 52 and are extracted along beam axis 58 through extractor 46.

Changes and modifications in the specifically described embodiments can be carried out without departing from the scope of the invention which is intended to be limited only by the scope of the appended claims.

What is claimed is:

1. An RF antenna for a plasma ion source, comprising:
   an insulating tube;
   a hollow conducting tube disposed within the insulating tube but not bonded thereto;
   a portion of the hollow insulating tube with disposed conducting tube being formed into a coil.

2. The RF antenna of claim 1 wherein the conducting tube is formed of metal or alloy.

3. The RF antenna of claim 1 wherein conducting tube is formed of titanium or stainless steel.

4. The RF antenna of claim 1 wherein the insulating tube is formed of glass.

5. The RF antenna of claim 1 wherein the insulating tube is formed of quartz.

6. The RF antenna of claim 1 wherein the insulating tube is formed of a high melting point glass and the conducting tube is formed of a high melting point metal or alloy.

7. A plasma ion source comprising:
   a source chamber;
   an RF antenna of claim 1 mounted within the chamber;
   an RF power source coupled to the conducting tube of the RF antenna.

8. The plasma ion source of claim 7 further comprising a coolant supply connected to the conducting tube of the RF antenna to flow a coolant through the conducting tube.

9. The plasma ion source of claim 7 wherein the source chamber is a multi-cusp ion source chamber having a plurality of permanent magnets disposed around the chamber.

10. The plasma ion source of claim 7 wherein the insulating tube is formed of a high melting point glass and the conducting tube is formed of a high melting point metal or alloy.

11. The plasma ion source of claim 7 wherein the outer diameter of the conducting tube is less than the inner diameter of the insulating tube and the conducting tube and insulating tube define an annular space therebetween.

12. The plasma ion source of claim 11 wherein the conducting tube contacts the insulating tube at some points, holding the conducting tube fixed within the insulating tube.

13. The RF antenna of claim 1 wherein the outer diameter of the conducting tube is less than the inner diameter of the insulating tube.

14. The RF antenna of claim 1 wherein the conducting tube and insulating tube define an annular space therebetween.

15. The RF antenna of claim 14 wherein the conducting tube contacts the insulating tube at some points, holding the conducting tube fixed within the insulating tube.

* * * * *